United States Patent
Chen et al.

(10) Patent No.: US 10,553,834 B2
(45) Date of Patent: Feb. 4, 2020

(54) METHOD FOR MANUFACTURING VAPOR DEPOSITION MASK AND METHOD FOR VAPOR DEPOSITION OF ORGANIC LIGHT-EMITTING MATERIAL

(71) Applicant: HON HAI PRECISION INDUSTRY CO., LTD., New Taipei (TW)

(72) Inventors: Ying-Chieh Chen, New Taipei (TW); Yasuhiro Mizuno, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/039,979

(22) Filed: Jul. 19, 2018

(65) Prior Publication Data
US 2019/0355938 A1    Nov. 21, 2019

(30) Foreign Application Priority Data
May 21, 2018    (CN) .......................... 2018 1 0491110

(51) Int. Cl.
H01L 51/56        (2006.01)
(52) U.S. Cl.
CPC ..................................... *H01L 51/56* (2013.01)
(58) Field of Classification Search
CPC ... H01L 51/56; H01L 51/0011; C23C 16/042; C23F 1/02; C23F 1/12; C23F 1/14
See application file for complete search history.

(56) References Cited

U.S. PATENT DOCUMENTS

| | | | |
|---|---|---|---|
| 2007/0181543 A1 | 8/2007 | Urairi et al. | |
| 2014/0377903 A1* | 12/2014 | Takeda | C23C 14/042 438/99 |
| 2016/0268511 A1 | 9/2016 | Takeda et al. | |
| 2016/0358980 A1* | 12/2016 | Inoue | H05B 33/145 |
| 2018/0053894 A1 | 2/2018 | Miyadera et al. | |
| 2018/0190906 A1* | 7/2018 | Takeda | H01L 51/56 |

FOREIGN PATENT DOCUMENTS

| | | |
|---|---|---|
| JP | 2014-133938 A | 7/2014 |
| WO | 2017/006821 A1 | 1/2017 |

* cited by examiner

*Primary Examiner* — Kyoung Lee
(74) *Attorney, Agent, or Firm* — ScienBiziP, P.C.

(57) ABSTRACT

A method for manufacturing a vapor deposition mask includes providing a substrate including a plastic film. An electrostatic protection film is placed on a surface of the plastic film. The substrate combined with the electrostatic protection film is fixed on a frame and tension applied. The plastic film is etched to form at least one opening in the plastic film and the electrostatic protection film is removed, leaving a vapor deposition mask. The manufacturing method prevents movement during manufacture and moisture and scratches during vapor deposition, and particles (debris) or otherwise during etching are non-existent.

18 Claims, 11 Drawing Sheets

METHOD FOR MANUFACTURING VAPOR DEPOSITION MASK AND METHOD FOR VAPOR DEPOSITION OF ORGANIC LIGHT-EMITTING MATERIAL

FIELD

The subject matter herein generally relates to a method for manufacturing a vapor deposition mask.

BACKGROUND

A method for making an organic light emitting diode (OLED) display panel generally includes forming organic light-emitting materials on a substrate (e.g., a thin film transistor substrate) by vapor deposition. A vapor deposition mask is used during the formation of the organic light-emitting materials on the substrate and the vapor deposition mask is positioned on the substrate. The main film of the vapor deposition mask used in vapor deposition is generally made of a metal. However, since the accuracy of the pattern process on the metal is difficult to control, a main film made of plastic is provided instead.

While the main film made of plastic is patterned, alignment problems of the main film and a metal frame often occur, which cause burrs and particles (debris) in the process. Burrs may cover the pixel area of the display panel and result in dark spot. The particles are generated by the accumulation of carbonized material, and can cause uneven brightness of the OLED display panel. In addition, if the main film absorbs moisture and is scratched, the vapor deposition quality and thus durability of the display panel is lowered.

Therefore, there is room for improvement in the art.

BRIEF DESCRIPTION OF THE DRAWINGS

Implementations of the present technology will now be described, by way of example only, with reference to the attached figures.

DETAILED DESCRIPTION

Figure 1:
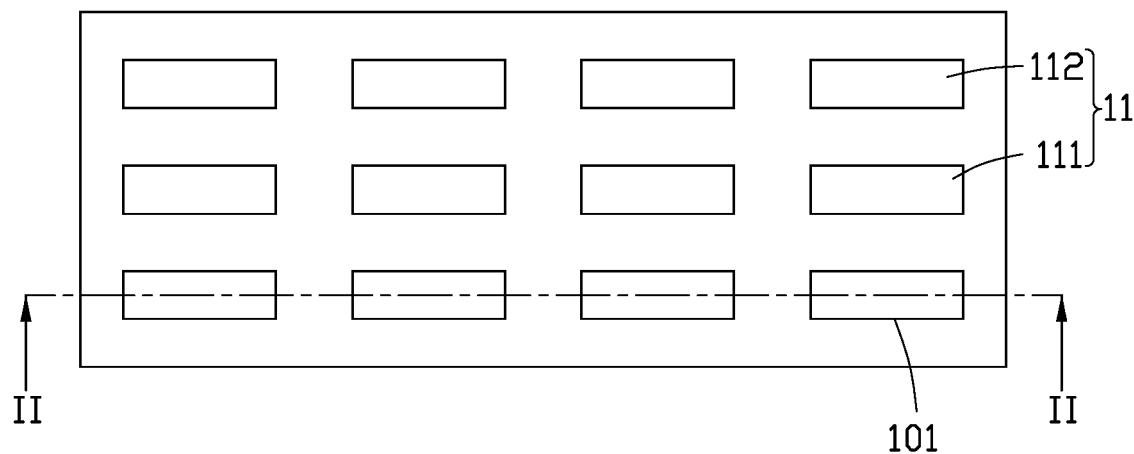
FIG. 1 is a planar view of a main film with openings of a first embodiment.

It will be appreciated that for simplicity and clarity of illustration, where appropriate, reference numerals have been repeated among the different figures to indicate corresponding or analogous elements. In addition, numerous specific details are set forth to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

A vapor deposition mask according to the present disclosure includes a plate-shaped substrate made of a plastic material, a metal layer that supports the plate-shaped substrate, and a plurality of holes that extend through the plate-shaped substrate. The plurality of holes enable deposit of vaporized materials sprayed by the vapor deposition nozzle onto designated positions of a substrate during the vapor deposition process. A method of manufacturing the vapor deposition mask comprises forming at least one electrostatic protective film on at least one outer surface of a main film including a plastic film. The main film is etched with the electrostatic protective film by laser etching to form a plurality of openings in the vapor deposition mask, and the electrostatic protective film is removed to form the vapor deposition mask. In one embodiment, at least two electrostatic protective films are formed on opposite surfaces of the main film. A plurality of embodiments of the method of manufacturing a vapor deposition mask will be specifically described hereinafter.

Figure 2:
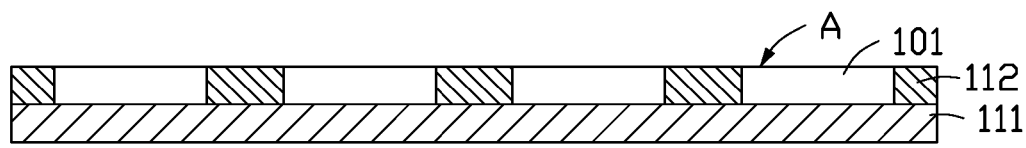
FIG. 2 is a cross-sectional view along line II-II of FIG. 1.

FIG. 1 through FIG. 8 are views illustrating a method of manufacturing a vapor deposition mask 100 according to a first embodiment. The method of manufacturing the vapor deposition mask 100 includes at least one or more of the following steps:

Step 1: as shown in FIG. 1 and FIG. 2, a main film 11 including a plastic film 111 is provided.

In one embodiment, the main film 11 further includes a metal layer 112. The metal layer 112 is provided on a side of the plastic film 111 and may be used to support the plastic film 111. The metal layer 112 is a thin metal plate having a least one first hole extending through the metal layer 112, other portion of the metal layer 112 without hole is in direct contact with the plastic film 111. In this embodiment, the metal layer 112 defines a plurality of first holes 101 arranged in a matrix and extending through the metal layer 112. It can be understood that in one embodiment, the metal layer 112 may have a first hole 101.

In this embodiment, an outer edge of the first portion of the metal layer 112 is flush with an outer edge of the plastic film 111. In other embodiments, the outer edge of the metal layer 112 may be smaller than the outer edge of plastic film 111, or larger than the outer edge of plastic film 111. Each of the plurality of first holes 101 is rectangular in shape, but not limited to such shape. Each of the plurality of first holes 101 may also be other shapes, such as circular or prismatic.

The material of the plastic film 111 may be one of polyethylene terephthalate (PET), Polycarbonate (PC), polyethylene (PE), polyether-ether-ketone (PEEK), polyetherimide (PEI), polyimide (PI), polyamide (PA), polytetrafluoroethylene (PTFE), silicon (Si), polypropylene (PP), polyphenylene sulfide (PPS), polyethylene naphthalate (PEN). In one embodiment, a coefficient of thermal expansion of the plastic film 111 is between 1.0 ppm/K and 15.0 ppm/K, and a thickness of the plastic film 111 is between 3 μm and 100 μm.

The material of the metal layer 112 may be made of a magnetic metal or a magnetic alloy, such as one of cobalt (Co), nickel (Ni), iron (Fe), titanium (Ti), and invar alloy. In one embodiment, a thickness of the metal layer 112 is between 5 μm and 50 μm.

Figure 3:
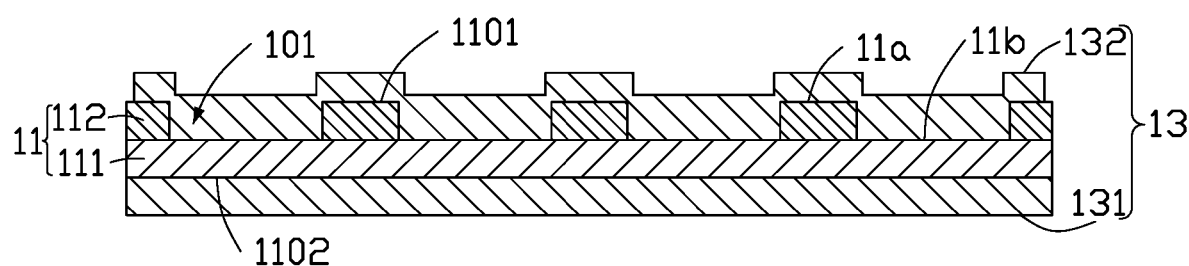
FIG. 3 is a cross-sectional view showing the main film attached to electrostatic protection films according to a first embodiment.

Step 2: as shown in FIG. 3, at least an electrostatic protection film 13 is formed on at least a surface of the main film 11.

In one embodiment, the at least one electrostatic protection film 13 is formed on a surface of the plastic film 111 away from the metal layer 112 and/or a surface of the metal layer 112 away from the plastic film 111. In this embodiment, opposite surfaces of the main film 11 each carry electrostatic protection film 13. The at least one electrostatic protection film 13 include a first electrostatic protection film 131 and a second electrostatic protection film 132. The first electrostatic protection film 131 covers the surface of the plastic film 111 away from the metal layer 112, and the second electrostatic protection film 132 covers the surface of the metal layer 112 away from the plastic film 111 and portions of the plastic film 111 corresponding to the first holes 101.

The electrostatic protection films 13 are transparent and can absorb electrostatic charges. In this embodiment, the electrostatic protection films 13 have the following characteristics.

(1) Water absorption of each electrostatic protection film 13 is less than 1%. In one embodiment, the water adsorption of each electrostatic protection film is less than 0.2%.

(2) Adhesion force of the electrostatic protection films 13 is in a range of about 0.1 N/20 mm to about 0.9N/20 mm.

(3) Light-transmittance of each electrostatic protection film 13 is greater than 95%. In one embodiment, the light-transmittance of each electrostatic protection film 13 is greater than 99%.

(4) The thickness of each electrostatic protection film 13 is in a range of about 3 μm to about 200 μm. In one embodiment, the thickness of each electrostatic protection film 13 is in a range of about 10 μm to about 50 μm.

The electrostatic protection films 13 are made of polymer materials. The materials of the electrostatic protection films 13 may be selected from cellulose acetate (CA), polyamide (PA), polyethylene terephthalate (PET), polycarbonate (PC), polyetheretherketone (PEEK), polyethylene naphthalate (PEN), polyimide (PI), polybutylene terephthalate (PBT), polystyrene (PS), polymethyl methacrylate (PMMA), polypropylene (PP), polyphenylene oxide (PPE), polyvinyl alcohol (PVA), polyvinyl chloride (PVC), polyolefin (PO), triphenyl phosphate (TPE), epoxy resin, melamine resin, urea-formaldehyde, vulcanized rubber, and polyurethanes.

In one embodiment, the electrostatic protection films 13 are made of thermosetting polymer, and will not be deformed or melted by heating during manufacturing of the vapor deposition mask 100.

In one embodiment, the metal layer 112 may be removed and the main film 11 may include no metal layer 112, the electrostatic protection films 13 may be in direct contact with opposite surfaces of the plastic film 111. In one embodiment, the electrostatic protection films 13 used for the main film 11 without the metal layer 112 is thicker than the electrostatic protection films 13 used for the main film 11 with the metal layer 112, and the electrostatic protection films 13 can be used to support the plastic film 111 instead of the metal layer 112.

In one embodiment, when the main film 11 has the metal layer 112, a thickness of the plastic film 111 is 5 μm and a thickness of the electrostatic protection film 13 is in a range of about 15 μm to about 25 μm. In one embodiment, when the main film 11 does not have the metal layer 112, the thickness of the plastic film 111 is also 5 μm, and the thickness of the electrostatic protection film 13 is 50 μm.

Figure 4:
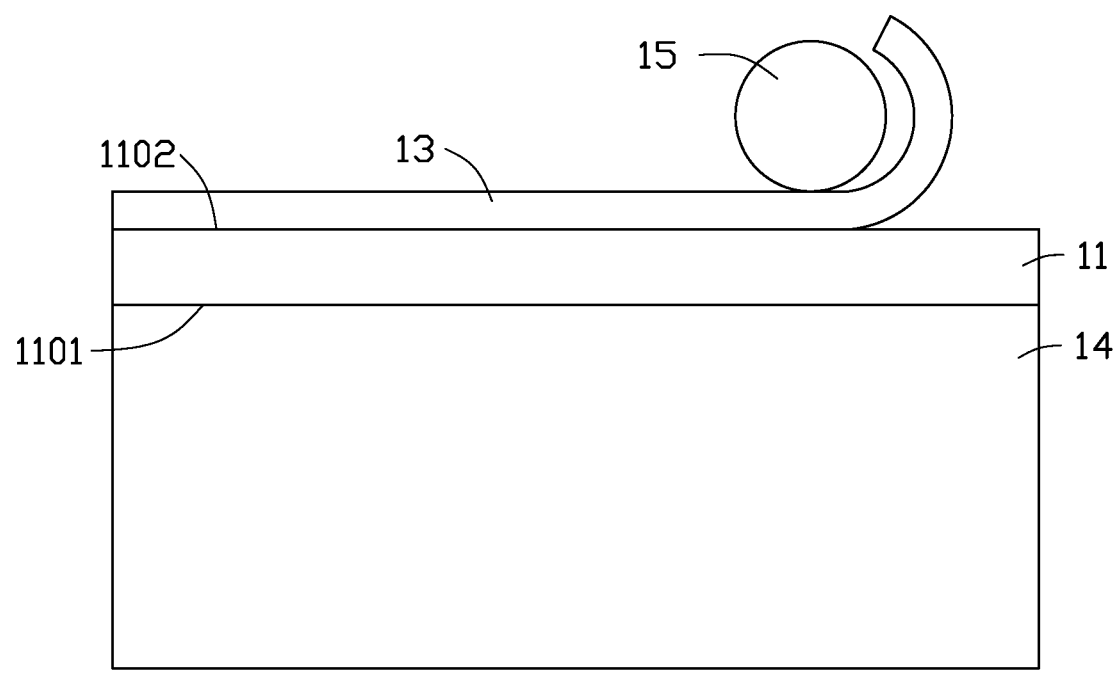
FIG. 4 is a view showing a laminating process.

As shown in FIG. 3 and FIG. 4, the electrostatic protection films 13 may be formed on the opposite surfaces of the main film 11. In this embodiment, the electrostatic protection films 13 are laminated on a first surface 1101 and a second surface 1102 of the main film 11. The first surface 1101 is adjacent to the metal layer 112, and the second surface 1102 is far away from the metal layer 112.

As shown in FIG. 4, the main film 11 is placed on a surface of a machine 14, and the second surface 1102 is away from the machine 14. The electrostatic protection film 13 is placed on the second surface 1102. A roller 15 is used to press the electrostatic protection film 13 on the main film 11. It can be understood that the electrostatic protection film 13 may be placed on the first surface 1101, and the roller 15 may be used to press the electrostatic protection film 13 on the main film 11.

The electrostatic protection films 13 are laminated on the at least one surface of the main film 11. In this embodiment, the electrostatic protection films 13 are directly attached to the first surface 1101 and the second surface 1102 of the main film 11. As shown in FIG. 3, the main film 11 comprises protruding portions 11a and recessed portions 11b. Portions of the electrostatic protection films 13 at the protruding portions 11a of the main film 11 are higher than other portions of the electrostatic protection films 13 at the recessed portions 11b of the main film 11.

In one embodiment, the electrostatic protection films 13 can be closely attached to the main film 11 by electrostatic adsorption. In other embodiments, the electrostatic protection films 13 may also be attached to the surface of the main film 11 by other processes. In this embodiment, the plastic film 111 and the electrostatic protection films 13 are attached by laminating, and are tightly held to each other by the electrostatic adsorption. The main film 11 and the electrostatic protection films 13 do not need to be attached by adhesive materials as an additional element, thus residues of adhesive materials do not exist.

The electrostatic protection films 13 prevent the main film 11 from absorbing moisture and being scratched, so as to improve durability and vapor deposition quality of the main film 11.

It can be understood that, in one embodiment, a main film 11 and a plurality of electrostatic protection films attached with the main film 11 can be provided directly.

Figure 5:
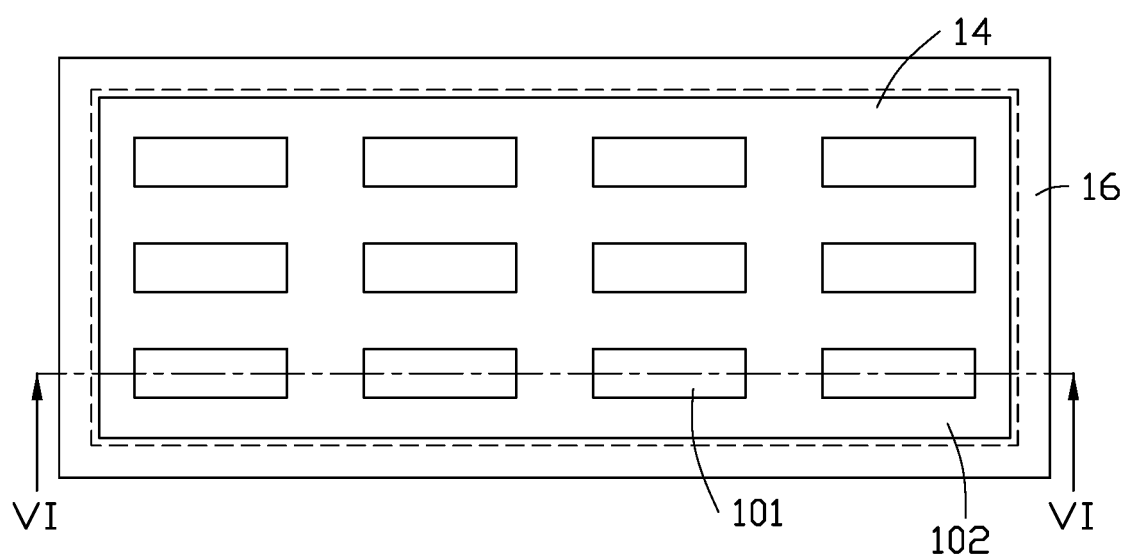
FIG. 5 is a planar view showing the main film fixed to a frame according to a first embodiment.
Figure 6:
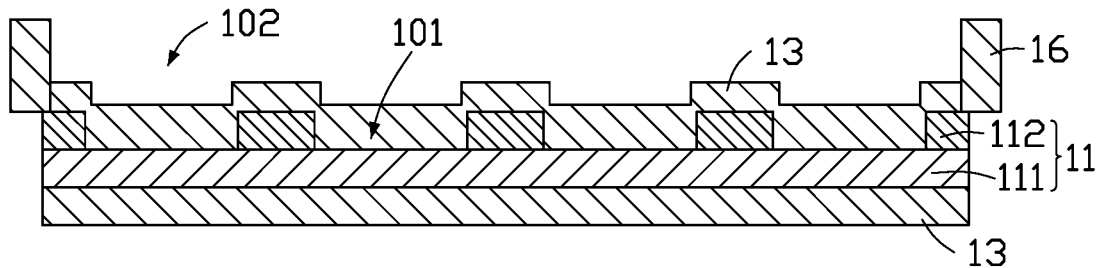
FIG. 6 is a cross-sectional view along line VI-VI of FIG. 5.

Step 3: as shown in FIG. 5 and FIG. 6, the main film 11 together with the at least one electrostatic protection film 13 is fixed to a frame 16.

The main film is thin and lacks rigidity, being easily bent. In one embodiment, to prevent the main film 11 from being bent when being fixed to the frame 16, a tensile force may be applied to the main film 11.

The frame 16 is positioned on the surface of the metal layer 112 away from the plastic film 111 and surrounds a peripheral portion of the main film 11 to support the main film 11. In this embodiment, the frame 16 is a square-shaped metal frame, the frame 16 defines a first opening 102. The first holes 101 air communicate with the first opening 102.

In this embodiment, the main film 11 may be fixed to the frame 16 by soldering. Specifically, at least a portion of the metal layer 112 may be soldered to fix the main film 11 and the frame 16, but the means of attachment is not thus limited. In other embodiment, the main film 11 may be fixed to the frame 16 by an adhesive material. It can be understood that the electrostatic protection film 13 attached on the surface of the metal layer 112 away from the plastic film 111 avoids any peripheral portion of the metal layer 112 overlapping with the frame 16.

The frame 16 may be made of at least one selected from invar alloy, nickel, and stainless steel, but is not limited to the above materials.

It can be understood that, the order of step 2 and step 3 can be reversed. In one embodiment, the main film 11 can be firstly fixed to the frame 16, and then the at least one electrostatic protection film 13 is attached to the at least one surface of the main film 11 away from the frame 16 and/or the surface of the main film 11 adjacent to the frame 16.

Figure 7:
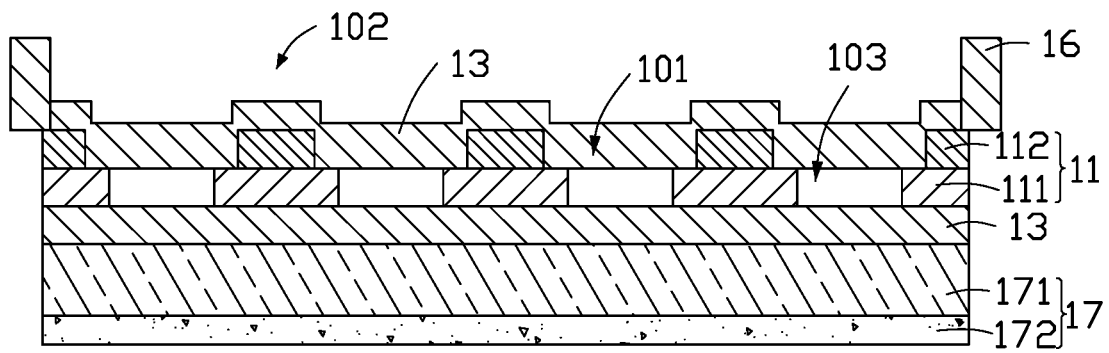
FIG. 7 is a cross-sectional view illustrating the main film being etched according to a first embodiment.

Step 4: as shown in FIG. 7, the plastic film 111 is etched to form a plurality of second openings 103 and the metal layer 112 is used as a mask. Each second opening 103 extends through the plastic film 111.

Portions of the plastic film 111 not covered with the metal layer 112 are etched. In this embodiment, the plastic film 111 may be etched by laser etching, and a laser source is positioned on a side of the main film 11 having the frame 16. In this embodiment, each of the plurality of second openings 103 is smaller than each of the first holes 101. In other embodiments, the size of each second opening 103 may be substantially the same as that of the first holes 101.

In this step, to prevent the main film 11 from moving during etching, a base 17 may be provided to support and fix the main film 11. The main film 11 is positioned on the base 17, the electrostatic protection film 13 is in direct contact with a surface of the base 17. The base 17 comprises a glass layer 171 and a magnet 172 on the glass layer 171, the plastic film 111 is positioned between the metal layer 112 and the glass layer 171. In this embodiment, at least one of the electrostatic protection films 13 is positioned on the surface of the main film 11 away from the glass layer 171, and the magnet 172 is positioned on the side of the glass layer 171 away from the main film 11. The plastic film 111, the electrostatic protection films 13, and the glass layer 171 can be tightly held together by electrostatic adsorption, and the magnet 172 is configured to attract the metal layer 112. This avoids the main film 11 moving when being etched, and a plurality of fine patterns of the main film 11 can be etched.

In this embodiment, the electrostatic protection films 13 are transparent, thus the laser passes through the electrostatic protection film 13. The laser does not etch the electrostatic protection film 13, but etches the plastic film 111. In this embodiment, the electrostatic protection films cover opposite surfaces of the main film 11, and particles (debris) generated by the accumulation of carbonized material can be adsorbed on the electrostatic protection films 13.

Figure 8:
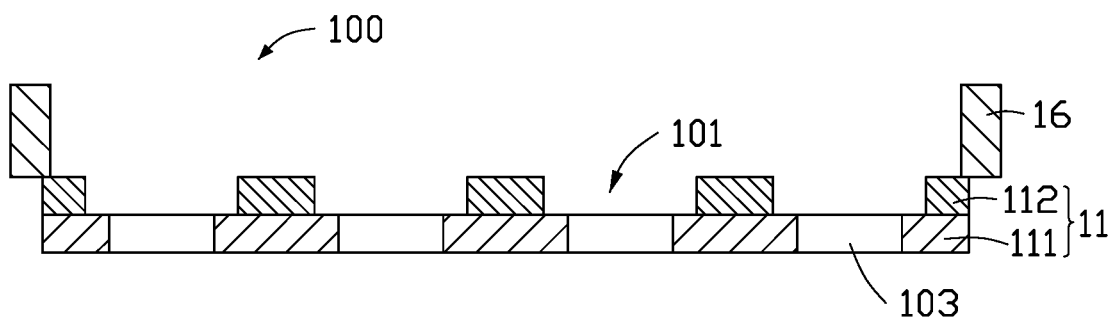
FIG. 8 is a cross-sectional view showing a vapor deposition mask of a first embodiment.

Step 5: as shown in FIG. 8, the electrostatic protection films 13 are removed, and the vapor deposition mask 100 defining the plurality of second openings 103 is formed.

In this embodiment, the electrostatic protection films 13 are positioned on opposite surfaces of the main film 11, the particles (debris) generated during etching can be taken away along with the electrostatic protection film 13. With the electrostatic protection films, particle (debris) residue is reduced, and accuracy of vapor deposition can be improved. In one embodiment, the electrostatic protection films 13 can be peeled off manually without additional equipment, which can reduce the cost of manufacturing.

In this embodiment, the plastic film 111, the electrostatic protection films 13 and the glass layer 171 can be tightly held together by electrostatic adsorption, and the magnet 172 can be configured to attract the metal layer 112. This avoids the main film 11 moving when being etched, and a plurality of fine patterns of the main film 11 can be etched.

The electrostatic protection films 13 can prevent the main film 11 from absorbing moisture and being scratched, so as to improve durability and vapor deposition quality of the main film 11.

In this embodiment, the plastic film 111 and the electrostatic protection films 13 attract each other by the electrostatic adsorption. The main film 11 and the electrostatic protection films 13 do not need to be attached by adhesive materials, and there will be no residues of adhesive materials.

The vapor deposition mask 100 can be used to vapor deposit an organic light-emitting material layer on a substrate 21, for example, the vapor deposition mask 100 can be used to deposit vapor to create organic light-emitting materials in a pixel region of an active array substrate of an OLED display device.

Figure 9:
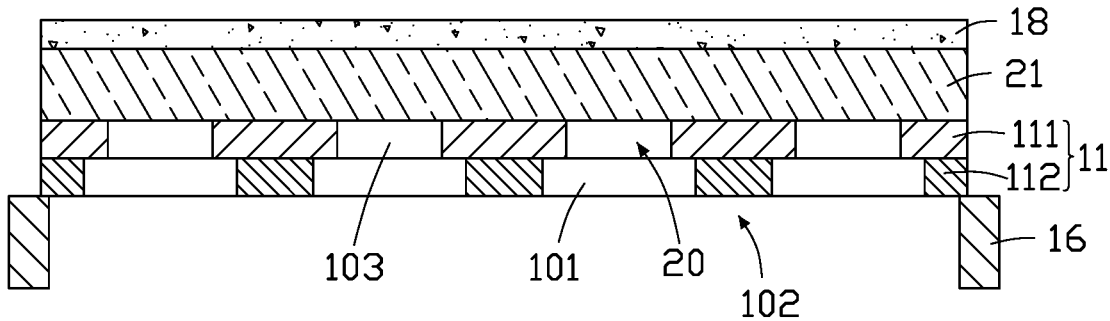
FIG. 9 is a view illustrating deposition of the vapor deposition mask of the first embodiment.

FIG. 9 illustrates a vapor deposition method using the vapor deposition mask 100 of the first embodiment. As shown in FIG. 9, a substrate 21 is positioned on a surface of the main film 11 of the vapor deposition mask 100. In this embodiment, the substrate 21 is positioned on the surface of the plastic film 111 away from the metal layer 112. Each second opening 103 is defined as a vapor deposition area 20. And then an evaporation source (not shown) comprising light-emitting materials is provided. The evaporation source is positioned on a side of the main film 11 away from the substrate 21. The evaporation source is heated and the organic light-emitting materials are vaporized. The organic light-emitting materials can pass through the first holes 101 and the second openings 103, and be deposited on the substrate 21.

In this embodiment, to attach the substrate 21 to the main film 11 more closely, a magnet layer 18 may be positioned on the side of the substrate 21 away from the main film 11. The magnet layer 18 is configured to attract the metal layer 112.

Figure 10:
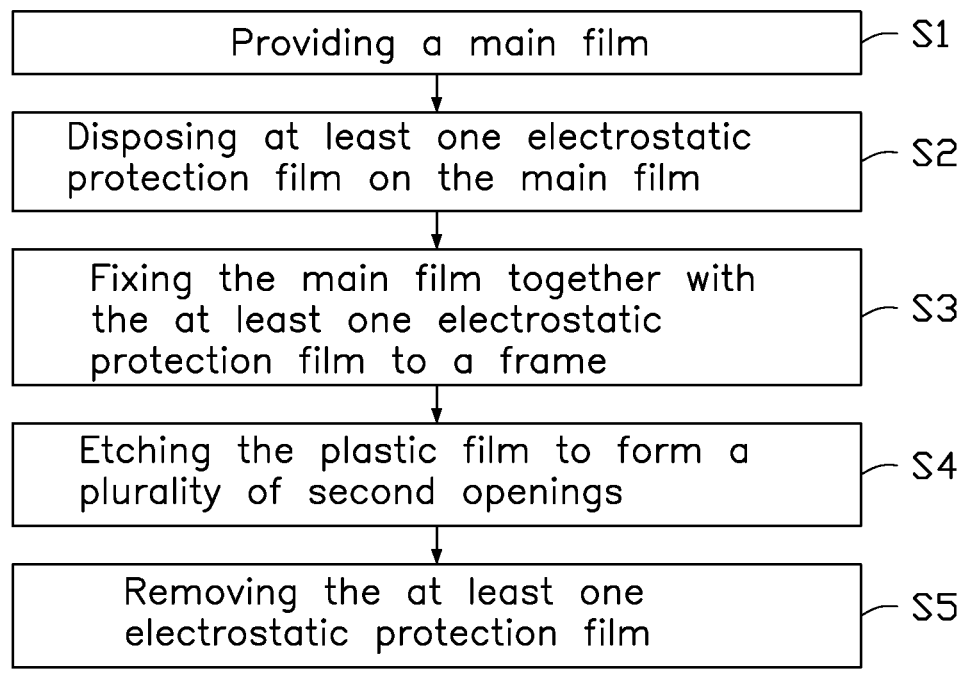
FIG. 10 is a flowchart for manufacturing the vapor deposition mask of the first embodiment.

FIG. 10 is a flowchart for manufacturing the vapor deposition mask according to the first embodiment. Although the following steps are described as a sequence, it can be understood that some of these steps may be skipped, performed in parallel, or not performed in an order of the above-described sequences. Generally, the method of manufacturing the vapor deposition mask 100 follows the sequence of the following steps. As shown in FIG. 10, the method of manufacturing the vapor deposition mask 100 comprises:

Step S1: a main film 11 is provided, the main film 11 comprises a plastic film 111.

Step S2: at least one electrostatic protection film 13 is positioned on the main film 11.

The at least one electrostatic protection film 13 is transparent and adsorbs an electrostatic charge. In one embodiment, the at least one electrostatic protection film 13 comprises two electrostatic protection films 13, the electrostatic protection films 13 covering opposite surfaces of the main film 11.

Step S3: the main film 11 together with the at least one electrostatic protection film 13 is fixed to a frame 16.

Step S4: the plastic film 111 is etched to form a plurality of second openings 103 extending through the plastic film 111.

Step S5: the electrostatic protection films 13 are removed and the vapor deposition mask 100 with the plurality of second openings 103 is formed.

Figure 11:
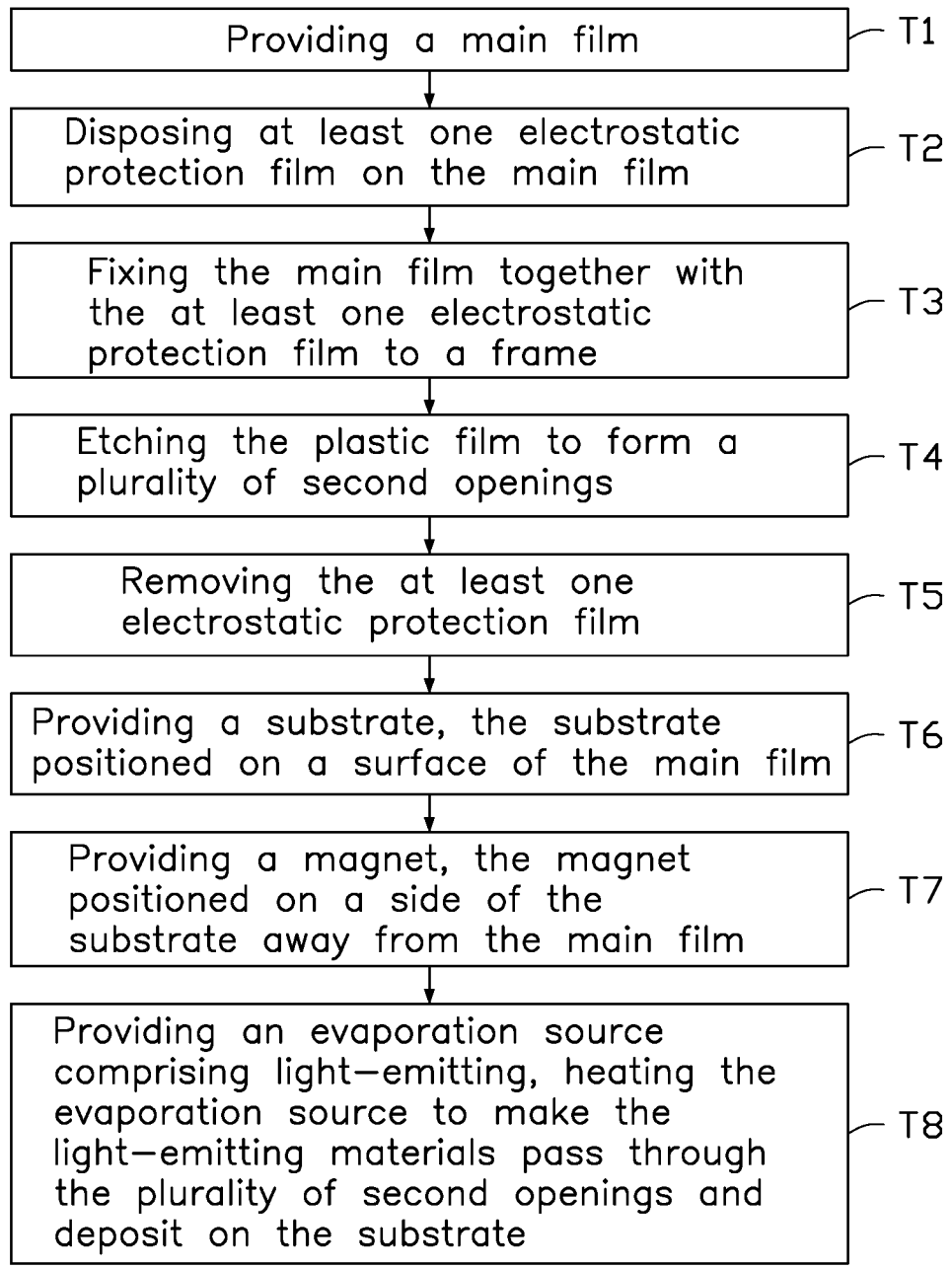
FIG. 11 is a flowchart for organic light-emitting materials deposited by the vapor deposition mask of the first embodiment.

FIG. 11 is a flowchart for the vapor deposition of organic light-emitting materials by the vapor deposition mask 100 according to the first embodiment. In one embodiment, a vapor deposition method of organic light-emitting materials comprises the method of manufacturing the vapor deposition mask 100 described above. That is, the formation of the vapor deposition mask and the formation of the organic light-emitting materials are performed on one production line for manufacturing an OLED panel, instead of using an independently-made vapor deposition mask 100. In this way, a factory can fabricate a vapor deposition mask 100 according to the required resolution of an OLED panel.

Step T1: a main film 11 is provided, the main film 11 comprises a plastic film 111.

Step T2: at least one electrostatic protection film 13 is positioned on the main film 11.

The at least one electrostatic protection film 13 is transparent and has a capability of electrostatic adsorption. In one embodiment, the at least one electrostatic protection film 13 comprises electrostatic protection films 13 covering opposite surfaces of the main film 11.

Step T3: the main film 11 together with the at least one electrostatic protection film 13 is fixed to a frame 16.

Step T4: the plastic film 111 is etched to form a plurality of second openings 103 extending through the plastic film 111.

Step T5: the electrostatic protection films 13 are removed and a vapor deposition mask 100 with the plurality of second openings 103 is formed.

Step T6: a substrate 21 is provided, the substrate 21 is positioned on a surface of the main film 11.

Step T7: a magnet 172 is provided, the magnet 172 is positioned on a side of the substrate 21 away from the main film 11.

Step T8: an evaporation source (not shown) comprising light-emitting materials is provided, the light-emitting materials is vaporized by heating. The light-emitting materials can pass through the second openings 103 and be deposited on the substrate 21.

It can be understood that, in one embodiment, an independently-made vapor deposition mask 100 can be provided when vapor depositing organic light-emitting materials.

Figure 12:
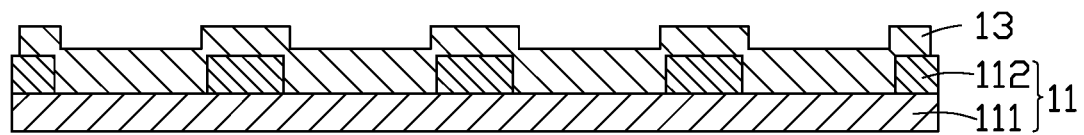
FIG. 12 is a cross-sectional view showing a main film attached to an electrostatic protection film according to another embodiment.

FIG. 12 illustrates a main film with an electrostatic protection film 13 according to another embodiment. In this embodiment, the electrostatic protection film 13 may be positioned on the surface of the metal layer 12 away from the plastic film 111.

Figure 13:
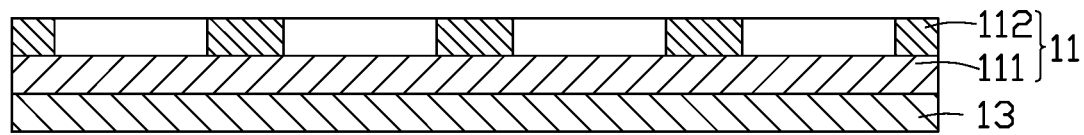
FIG. 13 is a cross-sectional view showing a main film attached to an electrostatic protection film according to another embodiment.

FIG. 13 illustrates a main film with an electrostatic protection film 13 according to another embodiment. In this embodiment, the electrostatic protection film 13 may be positioned on the surface of the plastic film 111 away from the metal layer 12.

Figure 14:
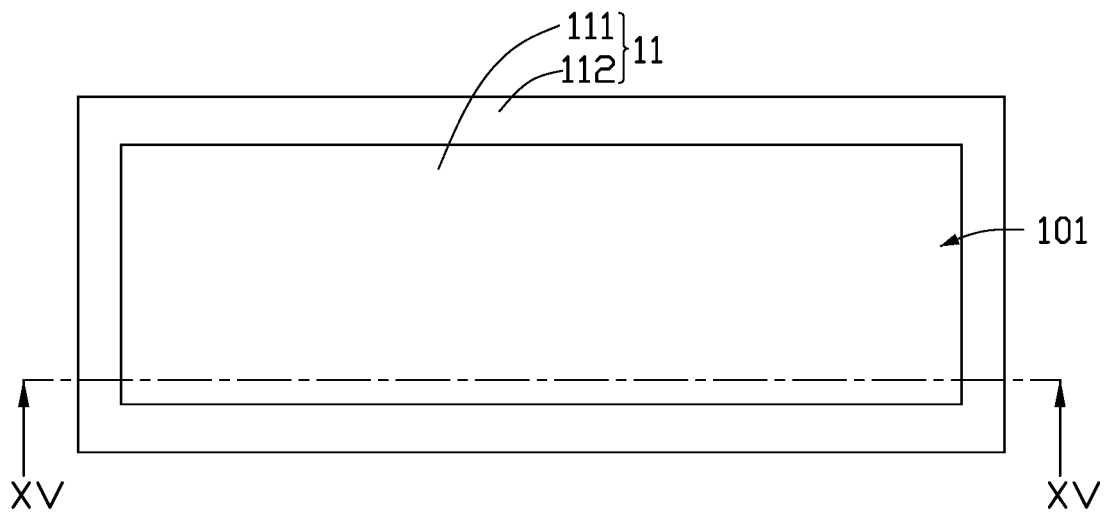
FIG. 14 is planar view showing a main film according to another embodiment.
Figure 15:
FIG. 15 is a cross-sectional view along line XV-XV of FIG. 14.

FIG. 14, and FIG. 15 illustrate a main film according to another embodiment, As shown in FIG. 14 and FIG. 15, the main film 11 includes a plastic film 111 and a metal film 112, the metal film 112 has only one first hole 101. The metal film 112 is coupled to a peripheral portion of the plastic film 111.

Figure 16:
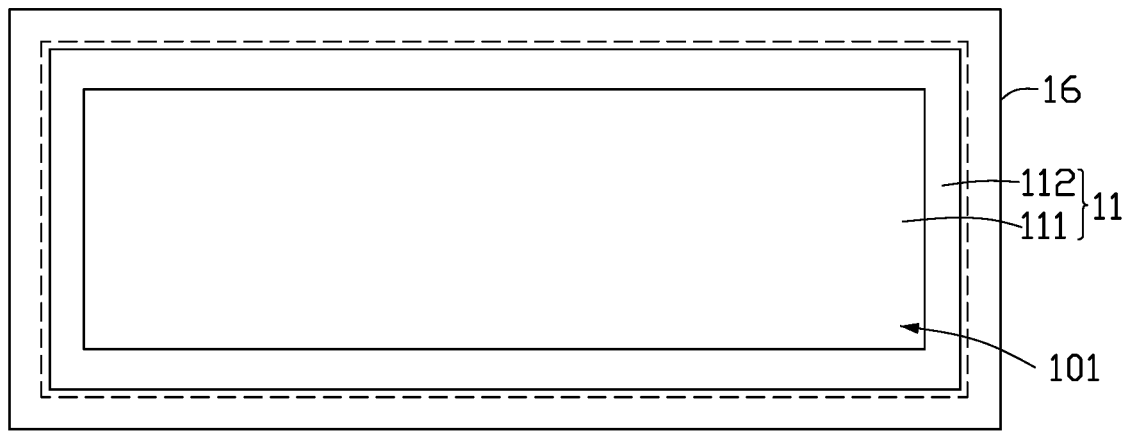
FIG. 16 is a cross-sectional view showing a main film fixed to a frame according to a second embodiment.

FIG. 16 illustrates a main film fixed to a frame according to a second embodiment. In this embodiment, the frame 16 only covers a peripheral portion of the main film 11, the metal film 112 may be fixed to the frame 16 by soldering.

Figure 17:
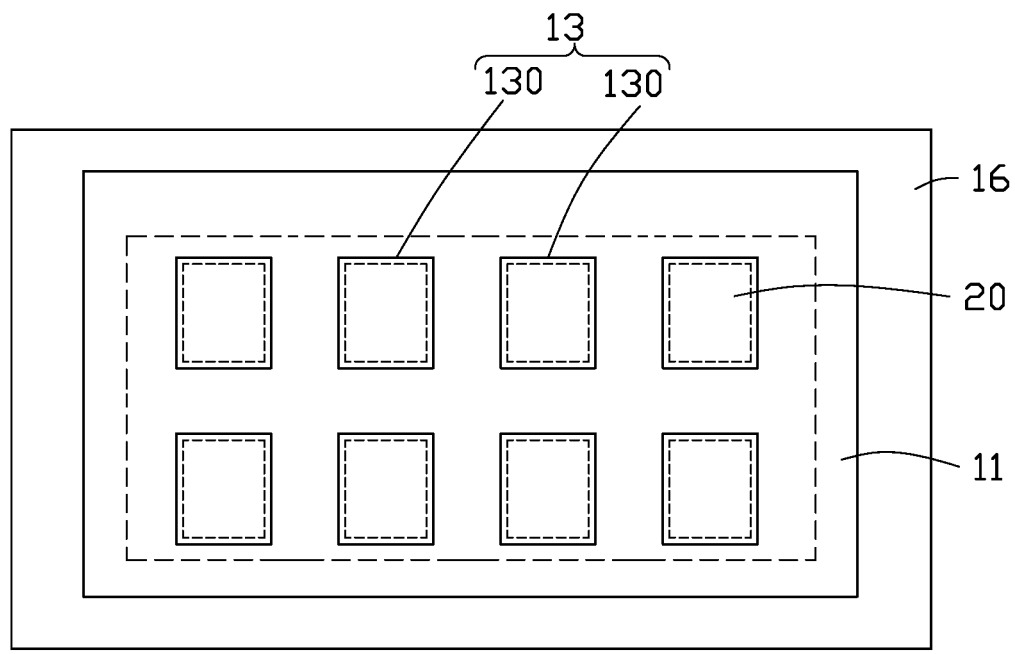
FIG. 17 is a cross-sectional view showing a main film fixed to a frame according to a third embodiment.

FIG. 17 illustrates a main film 11 fixed to a frame 16 according to a third embodiment. In this embodiment, the main film 11 and the frame 16 are substantially the same as the main film 11 and the frame shown in FIG. 14 through FIG. 16. The frame 16 is a square-shaped metal frame, the frame 16 has a first opening 102. The metal layer 112 has a plurality of first holes 101, the first holes 101 communicate with the first opening 102.

In this embodiment, the main film 11 defines eight vapor deposition areas 20. Electrostatic protection films 13 cover opposite surfaces of the main film 11. Each electrostatic protection film is discontinuous and divided into a plurality of second sub-layers 130, the plurality of second sub-layers are spaced apart from each other. In this embodiment, each electrostatic protection film is divided into eight second sub-layers 130. Each second sub-layer 130 covers a vapor deposition area 20.

Figure 18:
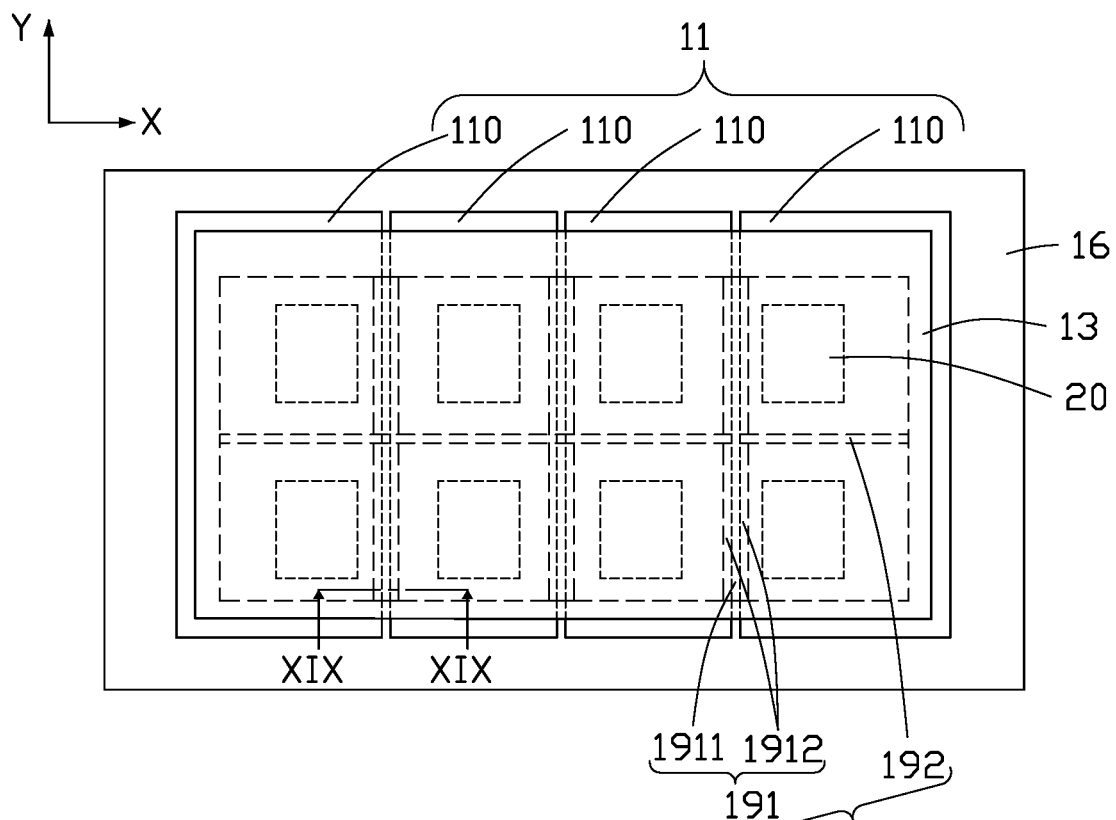
FIG. 18 is a cross-sectional view showing a main film fixed to a frame according to a fourth embodiment.

FIG. 18 illustrates a main film 11 fixed to a frame 16 according to a fourth embodiment. The frame 16 is a square-shaped metal frame, and the frame 16 further comprises a supporter 19. In this embodiment, the supporter 19 includes at least one first supporting portion 191 and at least one second supporting portion 192. In this embodiment, the supporter 19 includes three first supporting portions 191 and one second supporting portion 192. Each first supporting portion 191 extends along a Y direction, each second supporting portion 191 extends along an X direction. Each first supporting portion 191 intersects with the second supporting portion 192. Each first supporting portion 121 has two first ends fixed to the frame 16, each second supporting portion 122 has two second ends fixed to the frame 16.

As shown in FIG. 18, the main film 11 is discontinuous and divided into a plurality of first sub-layers 110 by the at least one first supporting portion 191. In this embodiment, the plurality of first sub-layers 110 are spaced from each other, each first sub-layer 110 comprises a metal layer 112 and a plastic film 111 stacked thereon. It can be understood that, in other embodiment, at least one first sub-layer 110 only comprises a plastic film 111.

In this embodiment, the main film 11 defines eight vapor deposition areas 20. In one embodiment, each vapor deposition area 20 is located between the first supporting portions 191 and the second supporting portion 192.

As shown in FIG. 18, in this embodiment, an electrostatic protection film 13 covers all the vapor deposition areas 20. The electrostatic protection film 13 is a continuous film.

Figure 19:
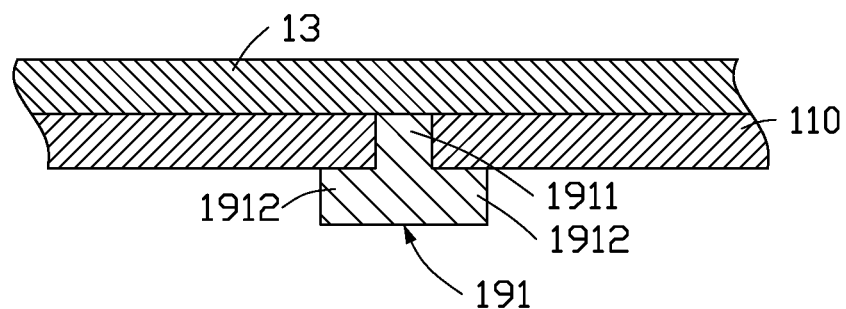
FIG. 19 is a cross-sectional view along line XIX-XIX of FIG. 18.

As shown in FIG. 19, each first supporting portion 191 includes a main portion 1912 and an extending portion 1911 extending from the main portion 1911. The main portion 1912 of each first supporting portion 191 supports two adjacent first sub-layers 110. The extending portion 1911 of each first supporting portion 191 is located between two adjacent first sub-layers 110 to separate the two adjacent first sub-layers 110.

In the embodiment, a width of the main portion 1912 is greater than a width of the extending portion 1911; and the width direction is perpendicular to a thickness direction of the first sub-layers 110. In the embodiment, the thickness of the extending portion 1911 is equal to the thickness of the first sub-layers 110, and the first extending portion 1911 is flush with the first sub-layers 110. In other embodiments, the thickness of the extending portion 1911 may be smaller than the thickness of the first sub-layers 110.

As shown in FIG. 19, in this embodiment, the electrostatic protection film 13 also covers the extending portion 1911.

Figure 20:
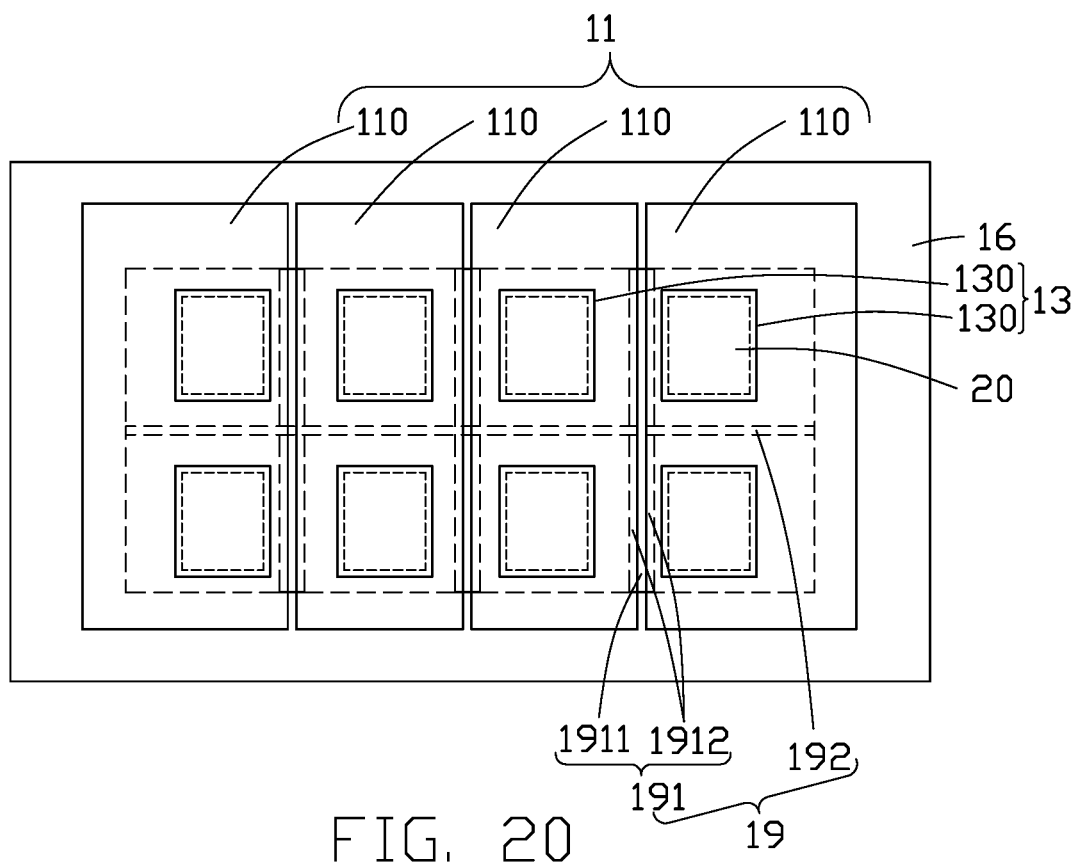
FIG. 20 is a cross-sectional view showing a main film fixed to a frame according to a fifth embodiment.

FIG. 20 illustrates a main film 11 fixed to a frame 16 according to a fifth embodiment. The main film 11 and the frame 16 are substantially the same as the main film 11 and the frame 16 of the fourth embodiment. In this embodiment, a least one electrostatic protection film is provided. Each electrostatic protection film is discontinuous and divided into a plurality of second sub-layers 130, the plurality of second sub-layers being spaced from each other. In this embodiment, each electrostatic protection film divided into eight second sub-layers 130. Each second sub-layer 130 covers a vapor deposition area 20.

Figure 21:
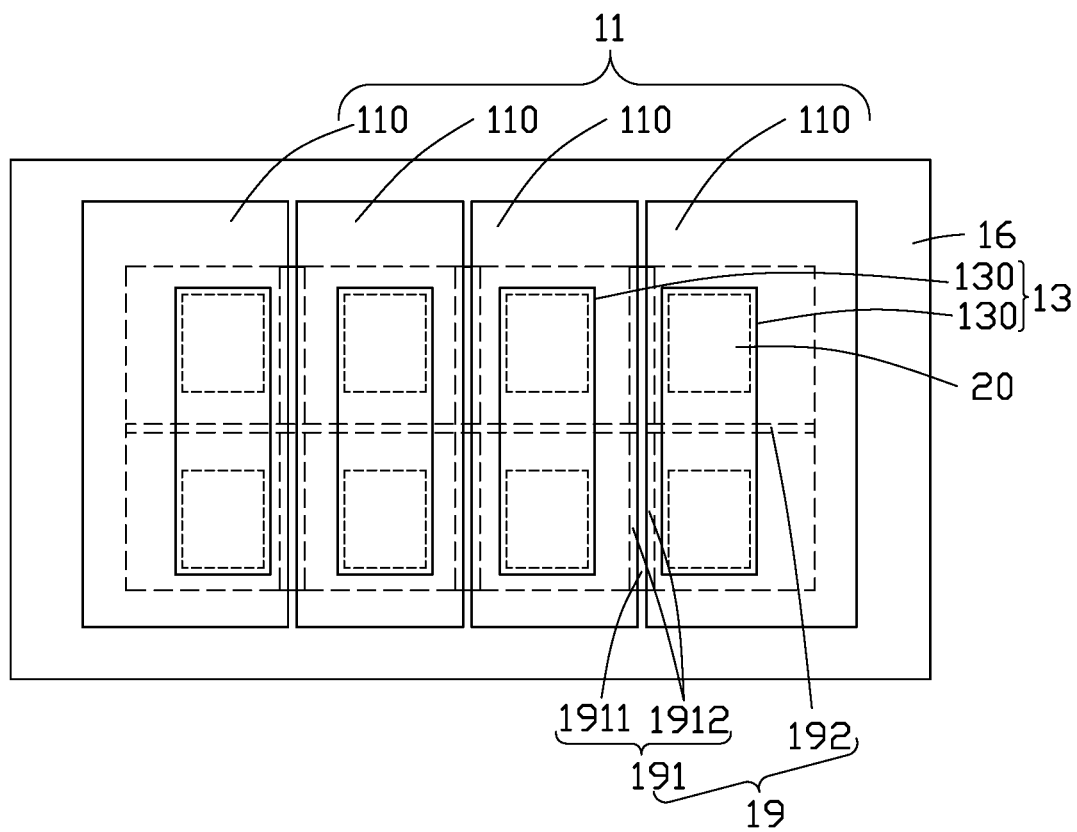
FIG. 21 is a cross-sectional view showing a main film fixed to a frame according to a sixth embodiment.

FIG. 21 illustrates a main film 11 fixed to a frame 16 according to a sixth embodiment. The main film 11 and the frame 16 are substantially the same as the main film 11 and the frame 16 of the fourth embodiment. In this embodiment, a least one electrostatic protection film is provided. Each electrostatic protection film is a discontinuous film, divided into a plurality of second sub-layers 130 which are spaced from each other. In this embodiment, each electrostatic protection film is divided into four second sub-layers 130. Each second sub-layer 130 covers two adjacent vapor deposition areas 20.

Figure 22:
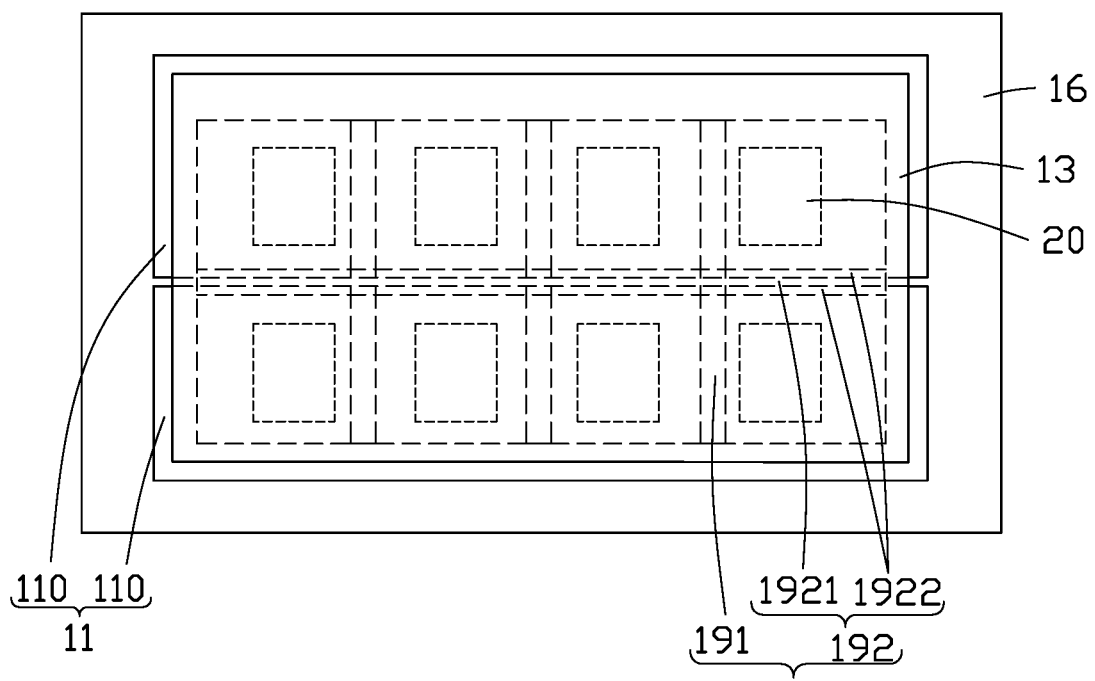
FIG. 22 is a cross-sectional view showing a main film fixed to a frame according to a seventh embodiment.

FIG. 22 illustrates a main film 11 fixed to a frame 16 according to a seventh embodiment. The frame 16 is a square-shaped metal frame, and the frame 16 further comprises a supporter 19. In this embodiment, the supporter 19 includes at least one first supporting portion 191 and at least one second supporting portion 192. In this embodiment, the supporter 19 includes three first supporting portions 191 and one second supporting portion 192. Each first supporting portion 191 extends along a Y direction, each second supporting portion 191 extends along an X direction. Each first supporting portion 191 intersects with the second supporting portion 192. Each first supporting portion 121 has two first ends fixed to the frame 16, each second supporting portion 122 has two second ends fixed to the frame 16.

As shown in FIG. 22, the main film 11 is divided into a plurality of first sub-layers 110 by the at least one first supporting portion 191. In this embodiment, the first sub-layers 110 are spaced from each other. In this embodiment, the main film 11 defines eight vapor deposition areas 20. In one embodiment, each vapor deposition areas 20 corresponds to a space between the first supporting portions 191 and the second supporting portion 192. In this embodiment, at least one 13 is provided. Each electrostatic protection film 13 is a continuous film. Each electrostatic protection film 13 covers all vapor deposition areas 20.

In this embodiment, each second supporting portion 192 includes a main portion 1922 and an extending portion 1921 extending from the main portion 1921. The main portion 1922 of each second supporting portion 192 supports two adjacent first sub-layers 110, and the extending portion 1921 of each second supporting portion 192 is located between two adjacent first sub-layers 110 to separate adjacent first sub-layers 110.

In the embodiment, a width of the main portion 1922 is greater than a width of the extending portion 1921; and the width direction is perpendicular to a thickness direction of the first sub-layers 110. In the embodiment, the thickness of the extending portion 1921 is equal to the thickness of the first sub-layers 110, and the first extending portion 1921 is flush with the first sub-layers 110. In this embodiment, the electrostatic protection film 13 also covers the extending portion 1911.

Figure 23:
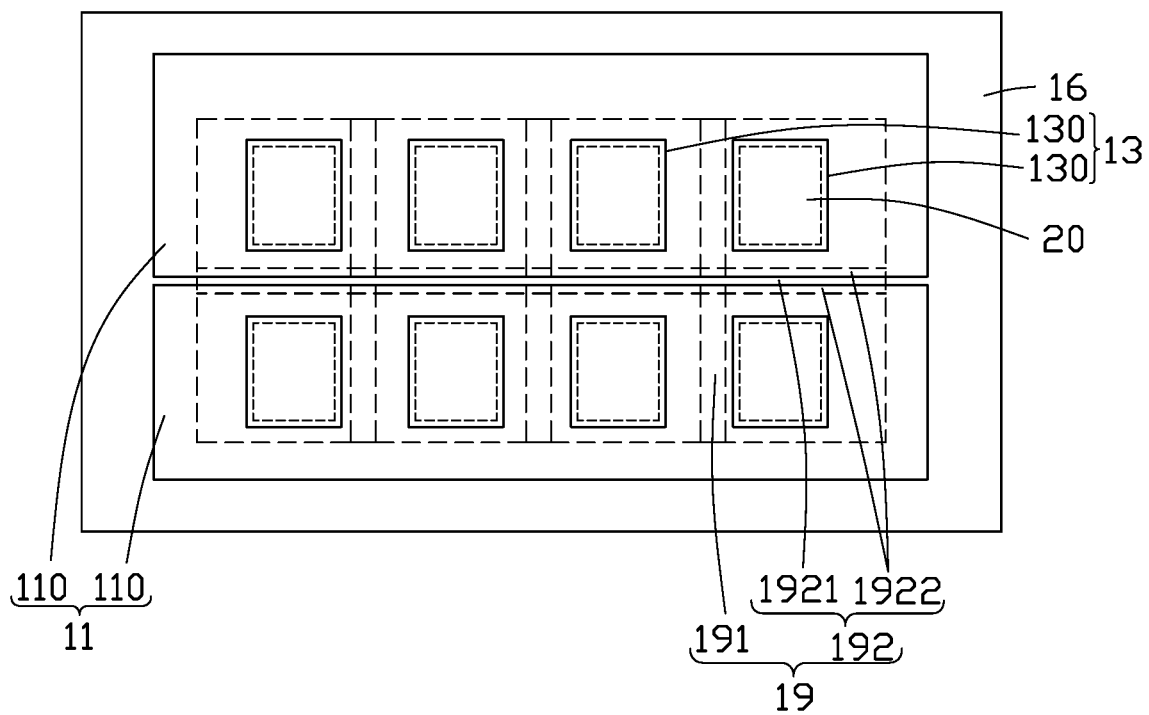
FIG. 23 is a cross-sectional view showing a main film fixed to a frame according to the eighth embodiment.

FIG. 23 illustrates a main film 11 fixed to a frame 16 according to an eighth embodiment. The main film 11 and the frame 16 are substantially the same as the main film 11 and the frame 16 of the seventh embodiment. In this embodiment, each electrostatic protection film 13 is divided into a plurality of second sub-layers 130, the second sub-layers are spaced from each other. In this embodiment, each electrostatic protection film is divided into eight second sub-layers 130. Each second sub-layer 130 covers a vapor deposition area 20.

Figure 24:
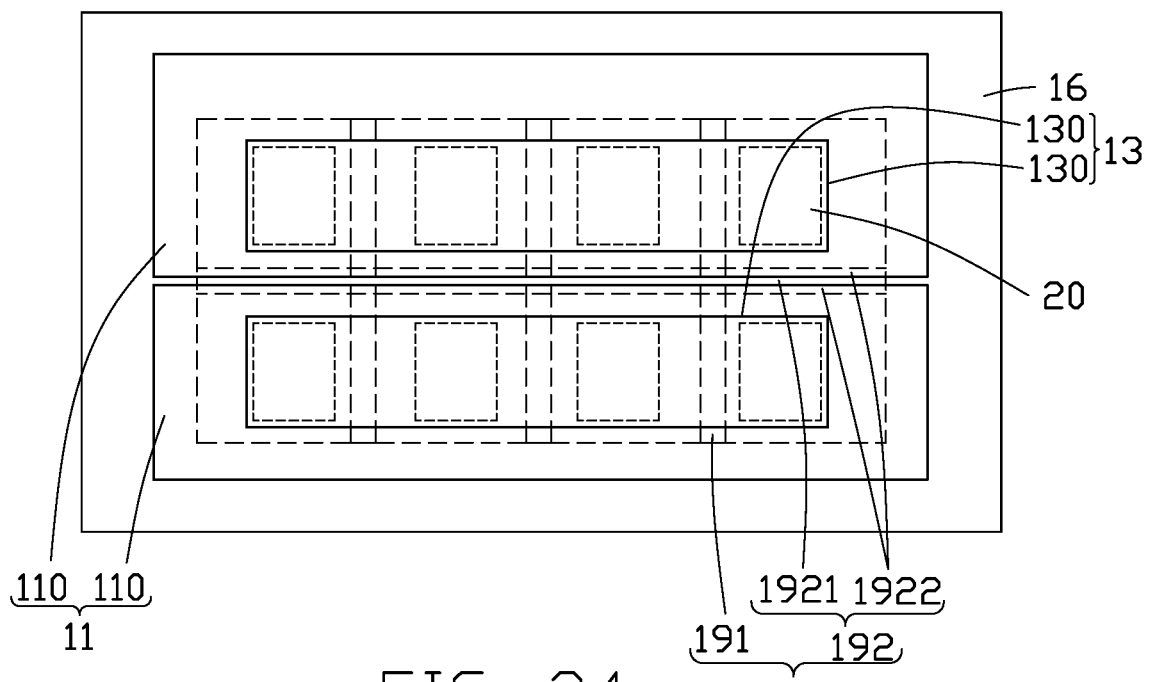
FIG. 24 is a cross-sectional view showing a main film fixed to a frame according to the ninth embodiment.

FIG. 24 illustrates a main film 11 fixed to a frame 16 according to a ninth embodiment. The main film 11 and the frame 16 are substantially the same as the main film 11 and the frame 16 of the seventh embodiment. In this embodiment, each electrostatic protection film 13 is divided into a plurality of second sub-layers 130, the second sub-layers are spaced from each other. In this embodiment, each electrostatic protection film is divided into four second sub-layers 130. Each second sub-layer 130 covers adjacent vapor deposition areas 20.

It can be understood that, in other embodiment, the supporter 19 may only have the first supporting portions 191, or may have only the second supporting portions 192. In one embodiment, both the first supporting portions 191 and the second supporting portions 192 may have no main portion or extending portion. In one embodiment, both the first supporting portions 191 and the second supporting portions 192 have a main portion or extending portion.

It can be understood that, the main film 11 and the electrostatic protection film 13 can be used with different structures. For example, in one embodiment, a continuous main film 11 or a main film 11 including a plurality of first sub-layers 110 may be used. A continuous electrostatic protection film 13 or an electrostatic protection film 13 including a plurality of second sub-films 130 may also be used.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A method of manufacturing a vapor deposition mask, comprising:
    providing a main film, the main film comprising a plastic film;
    forming at least one electrostatic protection film on the main film;
    fixing the main film together with the at least one electrostatic protection film to a frame, the at least one electrostatic protection film positioned on at least one of a surface of the main film away from the frame and a surface of the main film adjacent to the frame;
    etching the plastic film to form a plurality of openings each extending through the plastic film; and
    removing the at least one electrostatic protection film;
    wherein the main film further comprises a metal layer stacked on the plastic film;
wherein the metal layer partially covers the plastic film and does not cover any of the plurality of openings;
    wherein the at least one electrostatic protection film comprises a first electrostatic protection film covering a surface of the plastic film away from the metal layer and a second electrostatic protection film covering a surface of the metal layer away from plastic layer;
    wherein the second electrostatic protection film does not cover a peripheral portion of the metal layer; the frame covers the peripheral portion of the metal layer; the frame surrounds the second electrostatic protection film.

2. The method of claim 1, wherein the metal layer is made of a magnetic metal or a magnetic alloy.

3. The method of claim 1, wherein a base is used to support the main film when etching the plastic film.

4. The method of claim 3, wherein the base comprises a glass layer and a magnet, the plastic film is positioned between the metal layer and the glass layer; the magnet is positioned on a surface of the glass layer away from the main film; the magnet is configured to attract the metal layer.

5. The method of claim 1, wherein the at least one electrostatic protection film is made of polymer material, the at least one electrostatic protection film has a capability of electrostatic adsorption.

6. The method of claim 1, wherein etching the plastic film is carried out by laser etching.

7. The method of claim 6, wherein the at least one electrostatic protection film is not etched when etching the plastic film.

8. The method of claim 1, wherein a light-transmittance of the at least one electrostatic protection film is greater than 95%;
    a water absorption of the at least one electrostatic protection film is less than 1%
    an adhesion force of the at least one electrostatic protection film is between 0.1~0.9N/20 mm; and
    a thickness of the at least one electrostatic protection film is between 3 μm~200 μm.

9. The method of claim 1, wherein the frame further comprises a supporter, the supporter comprises at least one first supporting portion;
    each of the at least one first supporting portion extends along a first direction, each of the at least one first supporting portion comprises two first ends fixed to the frame.

10. The method of claim 9, wherein the supporter further comprises at least one second supporting portion;
    each of the at least one second supporting portion extends along a second direction, each of the at least one second supporting portion comprises two second ends fixed to the frame, the second direction is different from the first direction.

11. The method of claim 9, wherein the main film is a discontinuous film and comprises at least two first sub-layers spaced apart from each other;
    each of the at least one first supporting portion comprises a main portion and an extending portion extending from the main portion; the main portion supports two adjacent first sub-layers, the extending portion locates between two adjacent first sub-layers to separate the two adjacent first sub-layers.

12. The mask of claim 11, wherein one of the at least one electrostatic protection film is a discontinuous film and comprises at least two second sub-layers spaced apart from each other;
    each of the at least two first sub-layers is covered by at least one of the at least two second sub-layers.

13. A method for vapor deposition of organic light-emitting materials, comprising:
    providing a main film, the main film comprising a plastic film;
    forming at least one electrostatic protection film on the main film;
    fixing the main film together with the at least one electrostatic protection film to a frame, the at least one electrostatic protection film positioned on at least one of a surface of the main film away from the frame and a surface of the main film adjacent to the frame;
    etching the plastic film to form a plurality of openings each extending through the plastic film; and
    removing the at least one electrostatic protection film;
    providing a substrate, the substrate positioned on a surface of the main film;
    providing an evaporation source comprising light-emitting materials, the evaporation source positioned on a side of the main film away from the substrate;
    heating the evaporation source make the light-emitting materials to pass through the plurality of openings and deposit on the substrate;
    wherein the main film further comprises a metal layer stacked on the plastic film, the metal layer partially covers the plastic film; wherein the metal layer does not cover any of the plurality of openings;
    the vapor deposition method of organic light-emitting materials further comprises:
    providing a magnet on a side of the substrate away from the main film before heating the evaporation source.

14. The method of claim 13, wherein the metal layer is made of a magnetic metal or a magnetic alloy.

15. The method of claim 13, wherein the frame further comprises a supporter, the supporter comprises at least one first supporting portion;

each of the at least one first supporting portion extends along a first direction, each of the at least one first supporting portion comprises two first ends fixed to the frame;

the main film is a discontinuous film and comprises at least two first sub-layers spaced apart from each other;

each of the at least one first supporting portion comprises a main portion and an extending portion extending from the main portion; the main portion supports two adjacent first sub-layers, the extending portion locates between two adjacent first sub-layers to separate the two adjacent first sub-layers.

16. A method of manufacturing a vapor deposition mask, comprising:

providing a main film, the main film comprising a plastic film and a metal layer stacked on the plastic film, the metal layer partially covering the plastic film;

forming at least one electrostatic protection film on the main film, wherein the at least one electrostatic protection film comprises a first electrostatic protection film covering a surface of the plastic film away from the metal layer and a second electrostatic protection film covering a surface of the metal layer away from plastic layer and a surface of the plastic film having the metal layer;

fixing the main film together with the at least one electrostatic protection film to a frame, the frame covering a peripheral portion of the metal layer;

etching the plastic film to form a plurality of openings each extending through the plastic film; and removing the at least one electrostatic protection film.

17. The method of claim 16, wherein etching the plastic film comprises laser etching portions of the plastic film not covered by the metal layer to form the plurality of openings.

18. The method of claim 16, wherein the at least one electrostatic protection film is transparent to allow the laser to passes through.

* * * * *